(12) United States Patent
Lin et al.

(10) Patent No.: US 9,368,467 B2
(45) Date of Patent: Jun. 14, 2016

(54) SUBSTRATE STRUCTURE AND SEMICONDUCTOR PACKAGE USING THE SAME

(71) Applicant: Siliconware Precision Industries Co., Ltd., Taichung (TW)

(72) Inventors: Chang-Fu Lin, Taichung (TW); Ho-Yi Tsai, Taichung (TW); Chin-Tsai Yao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 56 days.

(21) Appl. No.: 13/654,713

(22) Filed: Oct. 18, 2012

(65) Prior Publication Data

US 2013/0341806 A1 Dec. 26, 2013

(30) Foreign Application Priority Data

Jun. 25, 2012 (TW) .............................. 101122596 A

(51) Int. Cl.

| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 23/498* | (2006.01) |
| *H05K 1/11* | (2006.01) |
| *H05K 3/34* | (2006.01) |

(52) U.S. Cl.
CPC .......... *H01L 24/16* (2013.01); *H01L 23/49816* (2013.01); *H05K 1/111* (2013.01); *H01L 24/13* (2013.01); *H01L 2224/0401* (2013.01); *H01L 2224/05572* (2013.01); *H01L 2224/131* (2013.01); *H01L 2224/13082* (2013.01); *H01L 2224/16238* (2013.01); *H01L 2224/81191* (2013.01); *H01L 2224/81385* (2013.01); *H01L 2924/00014* (2013.01); *H05K 3/3436* (2013.01); *H05K 2201/09727* (2013.01); *H05K 2201/10674* (2013.01); *Y02P 70/611* (2015.11)

(58) Field of Classification Search
USPC ......................................... 257/778, 737, 734
See application file for complete search history.

(56) References Cited

U.S. PATENT DOCUMENTS

| | | | | |
|---|---|---|---|---|
| 6,762,122 | B2 * | 7/2004 | Mis et al. ...................... | 438/683 |
| 2002/0171152 | A1 * | 11/2002 | Miyazaki ...................... | 257/778 |
| 2004/0238953 | A1 * | 12/2004 | Murtuza et al. ............... | 257/737 |
| 2006/0228829 | A1 * | 10/2006 | Hsu .............................. | 438/108 |
| 2008/0179740 | A1 * | 7/2008 | Liao ............................. | 257/738 |
| 2008/0265411 | A1 * | 10/2008 | Hu ............................... | 257/737 |
| 2012/0306104 | A1 * | 12/2012 | Choi et al. .................... | 257/782 |
| 2013/0334684 | A1 * | 12/2013 | Lin .................. | H01L 23/49838 257/737 |

* cited by examiner

*Primary Examiner* — Marc Armand
*Assistant Examiner* — Wilner Jean Baptiste
(74) *Attorney, Agent, or Firm* — Mintz Levin Cohn Ferris Glovsky and Popeo, P.C.; Peter F. Corless; Steven M. Jensen

(57) ABSTRACT

A substrate structure is provided, including a substrate body and a plurality of circuits formed on the substrate body. At least one of the circuits has an electrical contact for connecting to an external element and the electrical contact is narrower in width than the circuit, thereby meeting the requirements of fine line/fine pitch and miniaturization, improving the product yield and reducing the fabrication cost.

13 Claims, 3 Drawing Sheets

US 9,368,467 B2

SUBSTRATE STRUCTURE AND SEMICONDUCTOR PACKAGE USING THE SAME

CROSS-REFERENCES TO RELATED APPLICATIONS

This application claims under 35 U.S.C. §119(a) the benefit of Taiwanese Application No. 101122596, filed Jun. 25, 2012, the entire contents of which is incorporated herein by reference.

BACKGROUND OF THE INVENTION

1. Field of the Invention

The present invention relates to substrate structures and semiconductor packages, and, more particularly, to a substrate structure and a semiconductor package for flip-chip packaging.

2. Description of Related Art

Increased miniaturization, multi-function and high performance of electronic products require circuit boards or packaging substrates to have fine lines/fine pitches. Compared with a wire-bonding semiconductor package, a flip-chip semiconductor package has increased number of connections and becomes more popular.

FIG. 1 is a schematic top view of a conventional flip-chip packaging substrate. A plurality of circuits 11 are formed on the packaging substrate and an electrical contact 111 is formed at one end of each of the circuits 11 for electrical connection with a semiconductor chip. The electrical contact 111 is smaller in width than the circuit 11. As such, the density of the circuits 11 is limited by the size of the electrical contacts 111, thus adversely affecting the fabrication of high-density circuits and limiting the electrical performance of the semiconductor package.

To overcome the above-described drawbacks, a ball on trace (BOT) technology has been developed. Referring to FIG. 2, a portion of a circuit 21 serves as an electrical contact so as to eliminate the need to form an electrical contact and consequently eliminate the limitation posed by the electrical contact on the circuit density. Generally, the portion of the circuit 21 serving as the electrical contact is wider than the other portion so as to strengthen the flip-chip bonding and increase the product reliability. However, the wider portion of the circuit 21 limits the circuit density of the packaging substrate 2.

Further, increased circuit density of packages and increased number of electrode pads of semiconductor chips result in reduced size of solder balls 22, thus reducing the bonding strength between the solder balls 22 and the circuits 21 and hence reducing the product reliability.

Therefore, how to overcome the above-described drawbacks has become critical.

SUMMARY OF THE INVENTION

In view of the above-described drawbacks, the present invention provides a substrate structure, which comprises: a substrate body; and a plurality of circuits formed on the substrate body, wherein at least one of the circuits has an electrical contact for connecting to an external element and the electrical contact is narrower in width than the circuit.

The present invention further provides a semiconductor package, which comprises: a substrate structure comprising a substrate body and a plurality of circuits formed on the substrate body, wherein at least one of the circuits has an electrical contact for connecting to an external element and the electrical contact is narrower in width than the circuit; and a semiconductor chip having an active surface with a plurality of electrode pads and an inactive surface opposite to the active surface and disposed on the substrate body via the active surface thereof, wherein a conductive bump is formed between each of the electrode pads and the substrate body for electrically connecting the electrode pad and the corresponding electrical contact, thereby electrically connecting the semiconductor chip and the circuits.

In contrast to the prior art that maintains the width of small portions of circuits serving as electrical contacts unchanged while reducing the width of the remaining portions of the circuits, the present invention reduces the width of small portions of circuits serving as electrical contacts while keeping the width of the remaining portions of the circuits unchanged, thereby simplifying the circuit fabrication process, improving the product yield and reducing the fabrication cost. Further, the present invention strengthens the bonding between the semiconductor chip and the substrate structure so as to improve the reliability of the semiconductor package. Furthermore, the present invention increases pitches between the electrical contacts of adjacent circuits so as to meet the requirement of high-density and fine line/fine pitch circuits.

BRIEF DESCRIPTION OF DRAWINGS

FIGS. 3A to 3C are schematic views showing a substrate structure and a semiconductor package according to the present invention, wherein FIG. 3A is a perspective view, FIG. 3B is a top view, and FIG. 3C is a cross-sectional view taken along a sectional line AA of FIG. 3B.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as "end", "side", "on", "a" etc. are only used as a matter of descriptive convenience and not intended to have any other significance or provide limitations for the present invention.

Figure 3A:
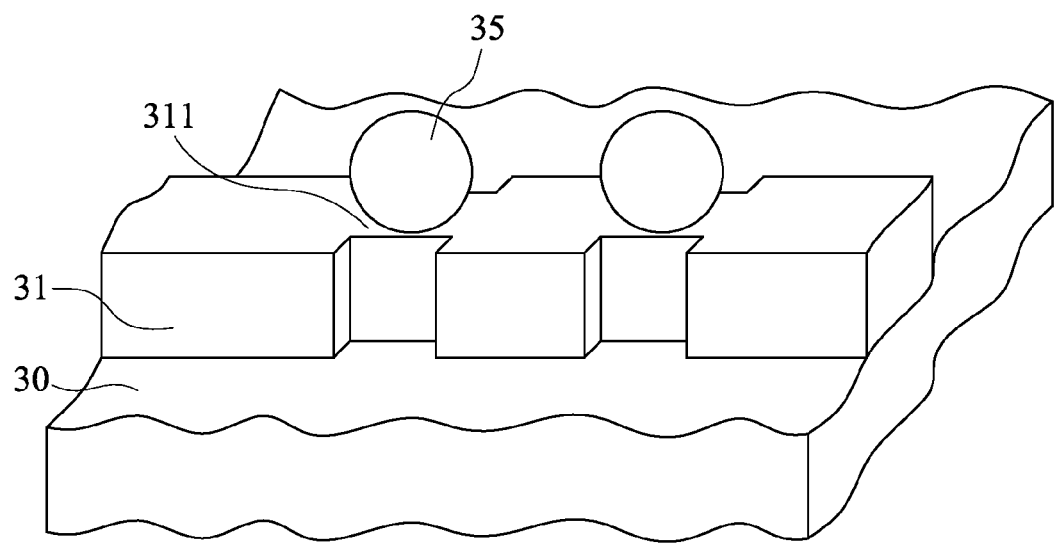
Figure 3B:
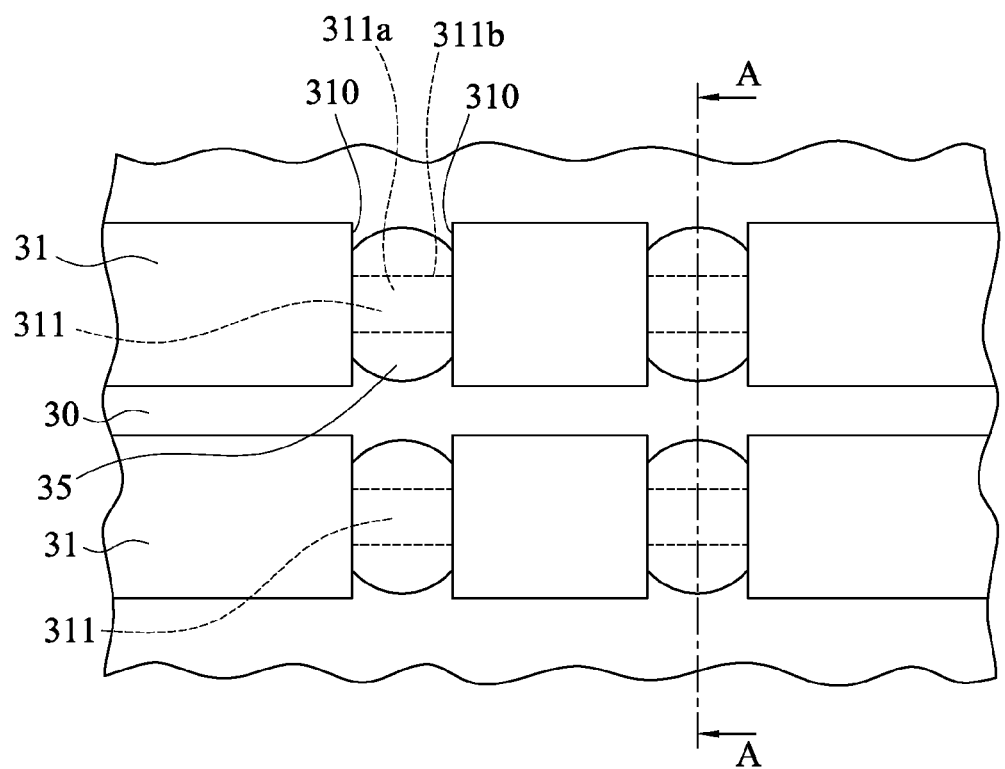
Figure 3C:
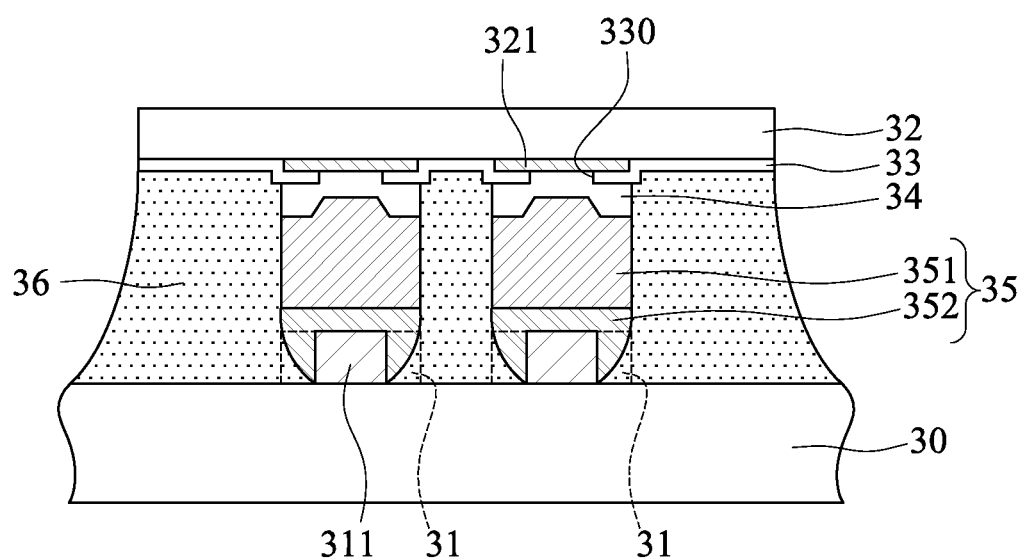

FIGS. 3A to 3C show a substrate structure and a semiconductor package using the same according to the present invention. FIG. 3A is a perspective view, FIG. 3B is a top view, and FIG. 3C is a cross-sectional view taken along a line AA of FIG. 3B. It should be noted that some components are omitted in FIGS. 3A and 3B. FIG. 3A shows the structure before a reflow process and FIG. 3B shows the structure after the reflow process.

A substrate body 30, such as a packaging substrate and a circuit board, is provided, and a plurality of circuits 31 are formed on the substrate body 30. A portion of the circuits 31 have electrical contacts 311 for electrically connecting to external elements, and the electrical contacts 311 have a width less than that of the circuits 31.

Figure 1:
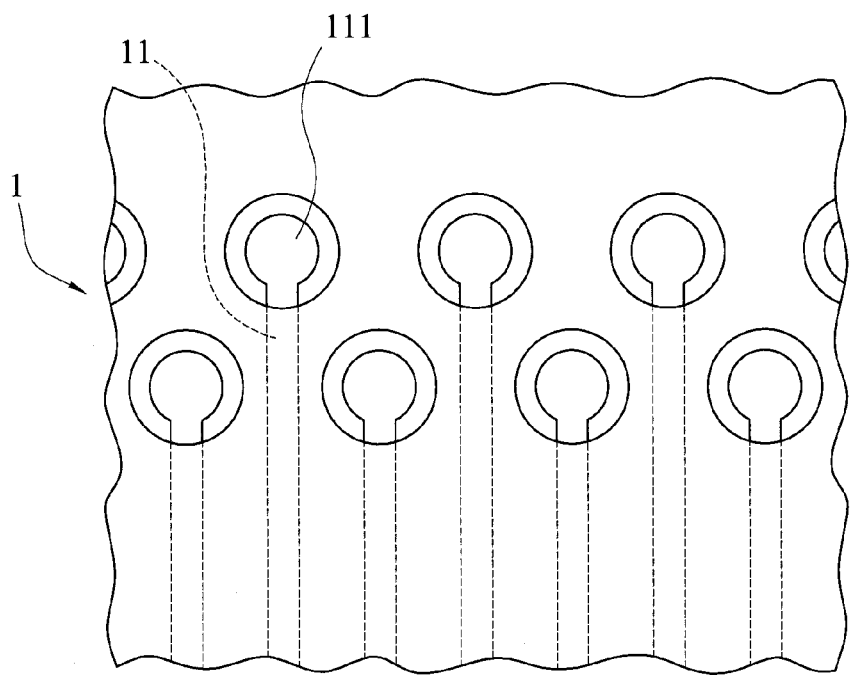
FIG. 1 is a schematic top view showing a conventional flip-chip packaging substrate.
Figure 2:
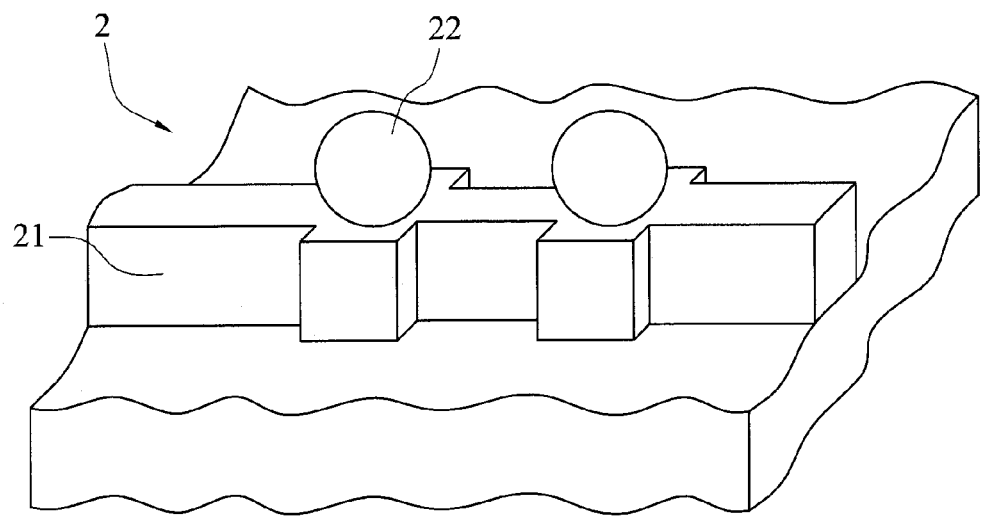
FIG. 2 is a schematic perspective view showing another conventional flip-chip packaging substrate.

The width of the electrical contacts 311 of the present embodiment is reduced to be equal to the width of the narrow portion of the circuit as shown in FIG. 2, and the width of the circuits of the present embodiment is increased to be equal to the width of the wide portion of the circuit as shown in FIG. 2. Preferably, the electrical contacts 311 have a width of 70 to 90% of the width of the circuits 31.

In the present embodiment, the circuits 31 are narrowed from opposite sides thereof along the width direction so as to form the electrical contacts 311. But the present invention is not limited thereto.

Further, a semiconductor chip 32 is disposed on the substrate body 30 in a flip-chip manner. The semiconductor chip 32 has an active surface with a plurality of electrode pads 321 and an active surface opposite to the active surface. An insulation layer 33 is formed on the active surface of the semiconductor chip 32, and a plurality of openings 330 are formed in the insulation layer 33 for exposing the electrode pads 321. According to the practical requirement, an UBM (Under Bump Metallurgy) layer 34 can be formed on each of the electrode pads 321 and a conductive bump 35 can further be formed on the UBM layer 34. The end portions of the conductive bumps 35 are disposed on the electrical contacts 311 so as to electrically connect the circuits 31. Further, an underfill 36 is formed between the semiconductor chip 32 and the substrate body 30.

In the present embodiment, each of the conductive bumps 35 has a metal post 351 and a solder material 352 formed on one end of the metal post 351 for bonding with the corresponding electrical contact 311. In other embodiments, the conductive bumps 35 can be made of a solder material.

Referring to FIG. 3B, the end portion of each of the conductive bumps 35 not only bonds with a top surface 311a of the corresponding electrical contact 311 but also bonds with side surfaces 311b of the electrical contact 311 and sectional surfaces 310 of the circuit 31 connecting to the side surfaces 311b of the electrical contact 311, thereby increasing the contact area between the solder bump 35 and the electrical contact 311 so as to strengthen the bonding therebetween.

Further referring to FIG. 3B, since the circuits 31 are narrowed to form the electrical contacts 311, the pitch between adjacent electrical contacts 311 is increased. As such, a portion of the solder material 352 can be received in the space between the adjacent electrical contacts 311 without causing a solder bridge to occur, thereby meeting the requirement of high-density and fine line/fine pitch circuits.

In contrast to the prior art that maintains the width of small portions of circuits serving as electrical contacts unchanged while reducing the width of the remaining portions of the circuits, the present invention reduces the width of small portions of circuits serving as electrical contacts while keeping the width of the remaining portions of the circuits unchanged, thereby simplifying the circuit fabrication process, improving the product yield and reducing the fabrication cost. Further, the present invention strengthens the bonding between the semiconductor chip and the substrate structure so as to improve the reliability of the semiconductor package. Furthermore, the present invention increases pitches between the electrical contacts of adjacent circuits so as to meet the requirement of high-density and fine line/fine pitch circuits.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A substrate structure, comprising:
a substrate body; and
a plurality of circuits formed on the substrate body, wherein at least one of the circuits has an electrical contact formed on the substrate body, the electrical contact is configured for connecting to an external element by the electrical contact being in contact with a conductive bump, the electrical contact and the circuit are in contact with a surface of the substrate body, the electrical contact is narrower in width than the circuit, the electrical contact directly connects to the circuit, and the circuits are free from covering a top surface of the electrical contact.

2. The substrate structure of claim 1, wherein the electrical contact is 10 to 30% narrower in width than the circuit.

3. The substrate structure of claim 1, wherein the circuit is narrowed from two opposite sides along a width direction so as to form the electrical contact.

4. A semiconductor package, comprising:
a substrate structure, comprising:
a substrate body; and
a plurality of circuits formed on the substrate body, wherein at least one of the circuits has an electrical contact formed on the substrate body for connecting to an external element, the electrical contact and the circuit are in contact with a surface of the substrate body, the electrical contact is narrower in width than the circuit, the electrical contact directly connects to the circuit, and the circuits are free from covering a top surface of the electrical contact; and
a semiconductor chip having an active surface with a plurality of electrode pads and an inactive surface opposite to the active surface and disposed on the substrate body via the active surface thereof, wherein a conductive bump is formed between and in contact with each of the electrode pads and the electrical contact for electrically connecting the electrode pad and the electrical contact, thereby electrically connecting the semiconductor chip and the circuits.

5. The semiconductor package of claim 4, wherein the electrical contact is 10 to 30% narrower in width than the circuit.

6. The semiconductor package of claim 4, wherein the circuit is narrowed from two opposite sides along a width direction so as to form the electrical contact.

7. The semiconductor structure of claim 4, wherein the conductive bump has an end portion bonded with side surfaces of the electrical contact and sectional surfaces of the circuit connected to the side surfaces of the electrical contact.

8. The semiconductor package of claim 4, wherein the conductive bump comprises a metal post and a solder material formed on the metal post for bonding with the corresponding electrical contact.

9. The semiconductor package of claim 4, wherein the conductive bump is made of a solder material.

10. The semiconductor package of claim 4, further comprising an underfill formed between the semiconductor chip and the substrate body.

11. The semiconductor package of claim 4, further comprising an insulation layer formed on the active surface of the semiconductor chip and having a plurality of openings for exposing the electrode pads.

12. The semiconductor package of claim 4, further comprising an under bump metallurgy layer formed between the conductive bump and the electrode pad.

13. The semiconductor package of claim 4, wherein the substrate body is a packaging substrate or a circuit board.

* * * * *